(12) United States Patent
Hao

(10) Patent No.: US 10,482,933 B2
(45) Date of Patent: Nov. 19, 2019

(54) COLUMN MULTIPLEXOR DECODING

(71) Applicant: GLOBALFOUNDRIES INC., Grand Cayman (KY)

(72) Inventor: Wuyang Hao, San Jose, CA (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/951,426

(22) Filed: Apr. 12, 2018

(65) Prior Publication Data

US 2019/0318771 A1    Oct. 17, 2019

(51) Int. Cl.
| | |
|---|---|
| *G11C 7/00* | (2006.01) |
| *G11C 7/12* | (2006.01) |
| *G11C 8/10* | (2006.01) |
| *G11C 7/18* | (2006.01) |

(52) U.S. Cl.
CPC .................. *G11C 7/12* (2013.01); *G11C 7/18* (2013.01); *G11C 8/10* (2013.01)

(58) Field of Classification Search
CPC ........................................................ G11C 7/12
USPC ..................................................... 365/189.02
See application file for complete search history.

(56) References Cited

U.S. PATENT DOCUMENTS

| | | | |
|---|---|---|---|
| 9,552,861 B2 * | 1/2017 | Iizuka ...................... G11C 5/06 |
| 10,162,005 B1 * | 12/2018 | Alzheimer ..... G01R 31/318547 |
| 2015/0364191 A1 * | 12/2015 | Muralimanohar ..... G11C 16/26 365/163 |

\* cited by examiner

*Primary Examiner* — Hoai V Ho
(74) *Attorney, Agent, or Firm* — David Cain; Andrew M. Calderon; Roberts Mlotkowski Safran Cole & Calderon, P.C.

(57) ABSTRACT

The present disclosure relates to a structure including a column multiplexor circuit with a plurality of bit line groups to perform a read operation of data using half of a plurality of column selection signals in the column multiplexor circuit, and each of the bit line groups comprises a reference bit line column, a plurality of transistors, and a plurality of bit lines.

13 Claims, 5 Drawing Sheets

| Data group | Group 20 | Group 30 | Group 40 | Group 50 |
| --- | --- | --- | --- | --- |
| Ref0 group | Group 30 | Group 20 | Group 30 | Group 20 |
| Ref1 group | Group 50 | Group 40 | Group 50 | Group 40 |
| Not used | Group 40 | Group 50 | Group 20 | Group 30 |

COLUMN MULTIPLEXOR DECODING

FIELD OF THE INVENTION

The present disclosure relates to column multiplexor decoding, and more particularly, to a circuit and a method for a compact column multiplexor decoding implementation for mid-point sensing.

BACKGROUND

In memory chips, column multiplexor area is dominated by the area associated with a number of routing wires, instead of the device area. For example, in a 128 column decoding scheme with four reference columns, the column multiplexor height area is dominated by the number of routing wires of 264 column selection signals at a predefined upper level of a memory chip (i.e., bit line and source line signals). Therefore, to have a compact memory chip layout, a simplified column multiplexor decoding scheme is needed which does not affect the functionality of the column multiplexor decoding scheme.

SUMMARY

In an aspect of the disclosure, a structure includes a column multiplexor circuit with a plurality of bit line groups to perform a read operation of data using half of a plurality of column selection signals in the column multiplexor circuit, and each of the bit line groups comprises a reference bit line column, a plurality of transistors, and a plurality of bit lines.

In another aspect of the disclosure, a circuit includes a plurality of bit lines, a plurality of reference bit lines, a first set of transistors with a drain connected to the plurality of reference bit lines and a source connected to a global source line, a second set of transistors with a drain connected to a word line and a source connected to a common source line, and an unused global mux output in the first set of transistors which is connected to a pull down leg to complete a current loop for performing a write operation of data.

In another aspect of the disclosure, a method includes inputting data to a first reference bit line column of a first bit line group in a circuit, selecting a second reference bit line column of a second bit line group in the circuit as a first reference bit line signal, selecting a third reference bit line column of a third bit line group in the circuit as an unused multiplexor output, selecting a fourth reference bit line column of a fourth bit line group in the circuit as a second reference bit line signal, and performing a read operation of the data on the first reference bit line column in the circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 2 shows a table for the column multiplexor decoding scheme in accordance with aspects of the present disclosure.

DETAILED DESCRIPTION

The present disclosure relates to column multiplexor decoding, and more particularly, to a circuit and a method for a compact column multiplexor decoding implementation for mid-point sensing. In more specific embodiments, the present disclosure saves column multiplexor layout area, reduces coupling, and reduces power consumption by reducing a number of multiplexor signals. Further, the present disclosure uses half the number of total bit lines along with global group decoding signals to decode the full number of bit lines during operation. More specifically, the present disclosure takes advantage of the fact that only three global signals out of four global signals are needed for mid-point sensing.

In conventional circuitry, a column multiplexor height area is dominated by wire routing of 264 column selection signals at a predefined upper level of a memory chip (i.e., bit lines and source lines). In an example of the conventional circuitry, a 128 decoding scheme with 4 reference columns has a pitch at the predefined upper level of the memory chip of Y (see FIG. 5). Further, in the conventional circuitry, a pull up voltage level (i.e., VPNU)/pull down voltage level (i.e., VPND) cap is used to fill available area under the metal routing. In contrast, the present disclosure reduces the column multiplexor layout area by reducing the number of wires at the predefined upper level of the memory chip.

Figure 1:
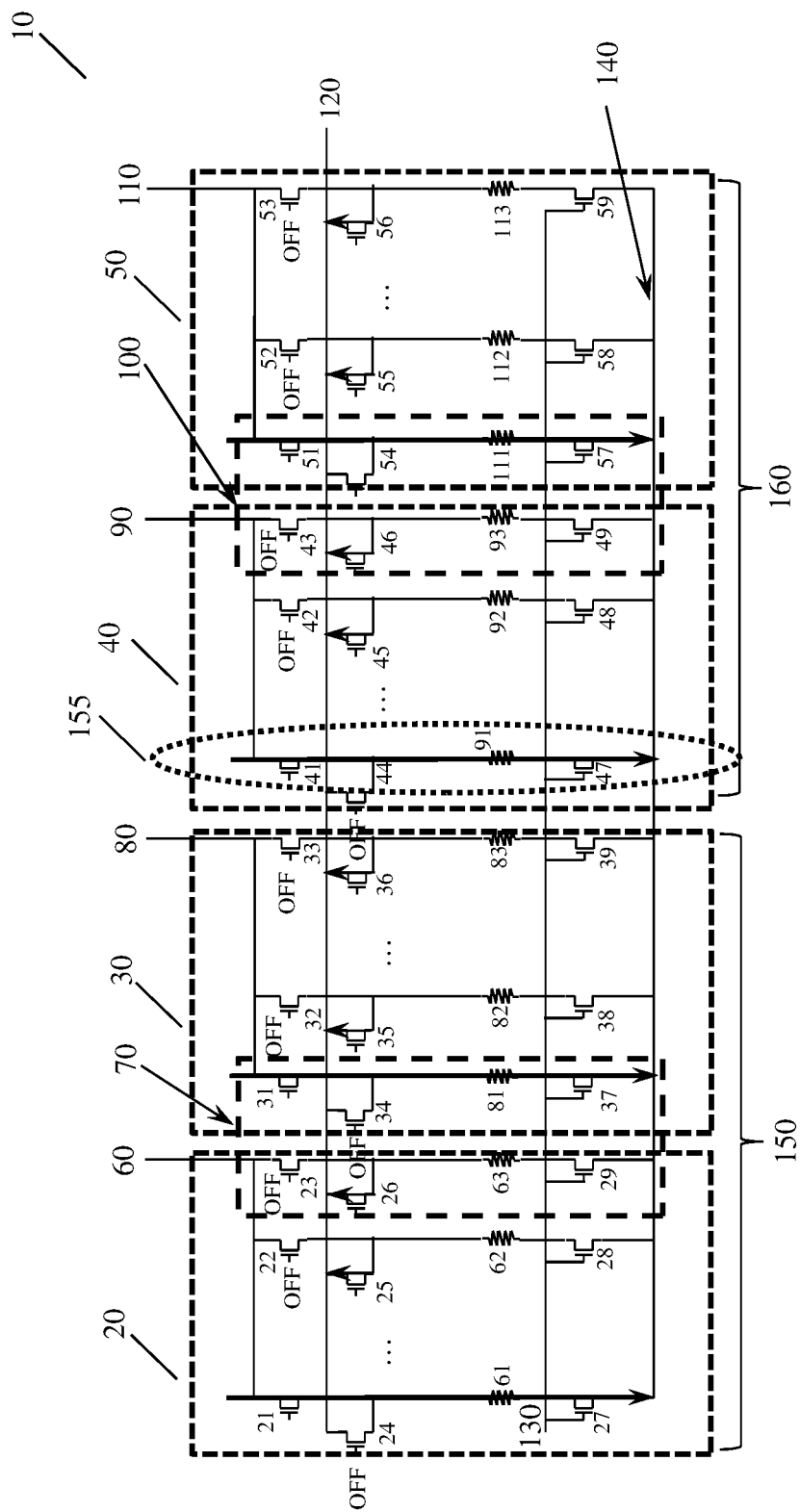
FIG. 1 shows a column multiplexor decoding scheme of a read operation in accordance with aspects of the present disclosure.

FIG. 1 shows a column multiplexor decoding scheme of a read operation in accordance with aspects of the present disclosure. In FIG. 1, the bit columns of the column mux circuit 10 are divided into four groups: group 20, group 30, group 40, and group 50. Each of the groups 20, 30, 40, and 50 include a corresponding reference column bit line 60, 80, 90, and 110. A left side 150 of the column mux circuit 10 includes 64 bit lines (i.e., 32 bit lines per group) and two reference column bit lines (i.e., reference column bit lines 60, 80). A right side 160 of the column mux circuit 10 includes 64 bit lines (i.e., 32 bit lines per group) and two reference column bit lines (i.e., reference column bit lines 90, 110).

In FIG. 1, the group 20 includes NMOS transistors 21, 22, and 23 with their drains connected to a reference column bit line 60 and their sources connected to a global source line 120. The group 20 also includes a NMOS transistor 24 with a drain connected to the global source line 120 and a source connected to a resistor 61. In addition, the group 20 includes a NMOS transistor 25 with its drain connected to the global source line 120 and its source connected to a resistor 62. Also, in group 20, a NMOS transistor 26 has its drain connected to the global source line 120 and its source connected to a resistor 63; whereas NMOS transistors 27, 28, and 29 have their gates connected to a word line 130 and their sources connected to a common source line 140.

In FIG. 1, the group 30 includes NMOS transistors 31, 32, and 33 with their drains connected to a reference column bit line 80 and their sources connected to a global source line 120. The group 30 also includes a NMOS transistor 34 with its drain connected to the global source line 120 and its source connected to a resistor 81. In addition, the group 30 includes a NMOS transistor 35 with its drain connected to the global source line 120 and its source connected to a resistor 82. Also, in group 30, a NMOS transistor 36 has a drain connected to the global source line 120 and a source connected to a resistor 83; whereas NMOS transistors 37, 38, and 39 have their gates connected to a word line 130 and their sources connected to a common source line 140.

In FIG. 1, the group 40 includes NMOS transistors 41, 42, and 43 with their drains connected to a reference column bit line 90 and their sources connected to a global source line 120. The group 40 also includes a NMOS transistor 44 with its drain connected to the global source line 120 and its source connected to the resistor 91. In addition, the group 40 includes a NMOS transistor 45 with a drain connected to the global source line 120 and a source connected to the resistor 92. Also, in the group 40, a NMOS transistor 46 has its drain connected to the global source line 120 and its source connected to the resistor 93; whereas NMOS transistors 47, 48, and 49 have their gates connected to a word line 130 and their sources connected to a common source line 140.

In FIG. 1, the group 50 includes NMOS transistors 51, 52, and 53 with their drains connected to a reference column bit line 110 and their sources connected to a global source line 120. The group 50 also includes a NMOS transistor 54 with its drain connected to the global source line 120 and its source connected to a resistor 111. In addition, the group 50 includes a NMOS transistor 55 with its drain connected to the global source line 120 and its source connected to a resistor 112. Also, in the group 50, a NMOS transistor 56 has its drain connected to the global source line 120 and its source connected to a resistor 113; whereas NMOS transistors 57, 58, and 59 have their gates connected to a word line 130 and their sources connected to a common source line 140.

In FIG. 1, a reference pair 70 includes two reference column bit lines 60, 80 of the groups 20, 30. Further, another reference pair 100 includes two reference column bit lines 90, 110 of the groups 40, 50. FIG. 1 also includes an unused global mux output 155 which is filtered out for next level read muxing.

In FIG. 1, to reduce the number of column selection signals, half of the current column selection bus (e.g., 64 column selection signals) can be used to decode regular data bit lines. In embodiments, the decoding is achieved by utilizing the fact that three global bit lines (output of bit line multiplexor) out of four global bit lines are needed to read out one bit line data with the assistance of two reference bit lines. Further, there is an unused mux output, which is selected as a global bit line by repeated 64 decoding (e.g., selected by 64 decoding but not used during a read operation). Further, although FIG. 1 is applied to repeated 64 decoding, the present disclosure can be applied to a broad case in which the number of multiplexing signals is reduced by roughly half versus a conventional circuitry scheme.

For example, in a read operation as shown in FIG. 1, if DATA is input to the reference column bit line 60 (i.e., the reference column bit line 60 has DATA) in group 20, then the reference column bit lines 80, 110 (i.e., the reference column bit line 80 in group 30 and the reference column bit line 110 in group 50) will act as REF0 and REF1 (i.e., reference signals) for the read out. In this scenario, the reference bit line 90 for group 40 will be unused.

In the read operation for FIG. 1, NMOS transistors 22, 23, 24, 32, 33, 34, 36, 42, 43, 44, 52, and 53 are OFF and NMOS transistors 21, 25, 26, 27, 28, 29, 31, 35, 37, 38, 39, 41, 45, 46, 47, 48, 49, 51, 54, 55, 56, 57, 58, and 59 are ON. Further, as shown in the read operation in FIG. 1, downward current flow occurs from transistor 21 to transistor 27, from transistor 41 to transistor 47, and from transistor 51 to transistor 57. Further, upward current flow occurs through transistors 25, 26, 35, 36, 45, 46, 55, and 56. In the present disclosure, the circuit uses 64 column selection signals instead of 128 column selection signals to save wiring space and reduce the column multiplexor layout area. Further, although FIG. 1 is applied to 64 column selection signals, the present disclosure can be applied to a broad case in which the number of multiplexing signals is reduced by roughly half versus a conventional circuitry scheme.

FIG. 2 shows a table for the column multiplexor decoding scheme in accordance with aspects of the present disclosure. FIG. 2 shows different scenarios for the read operation in FIG. 1. As discussed above, the first scenario has DATA being input to the reference column bit line 60 in group 20, the reference column bit line 80 in group 30 acting as REF0, the reference column bit line 110 in group 50 acting as REF1, and the reference column bit line 90 in group 40 being unused. Further, in a second scenario, DATA is input to the reference column bit line 80 in group 30, the reference column bit line 60 in group 20 acts as REF0, the reference column bit line 90 in group 40 acts as REF1, and the reference column bit line 110 in group 50 is unused. In a third scenario, DATA is input to the reference column bit line 90 in group 40, the reference column bit line 80 in group 30 acts as REF0, the reference column bit line 110 in group 50 acts as REF1, and the reference column bit line 60 in group 20 is unused. Lastly, in a fourth scenario, DATA is input to the reference column bit line 110 in group 50, the reference column bit line 60 in group 20 acts as REF0, the reference column bit line 90 in group 40 acts as REF1, and the reference column bit line 80 in group 30 is unused. Each of these scenarios in FIG. 2 can be used in the read operation of FIG. 1, depending on the reference column bit line receiving the DATA input.

Figure 3:
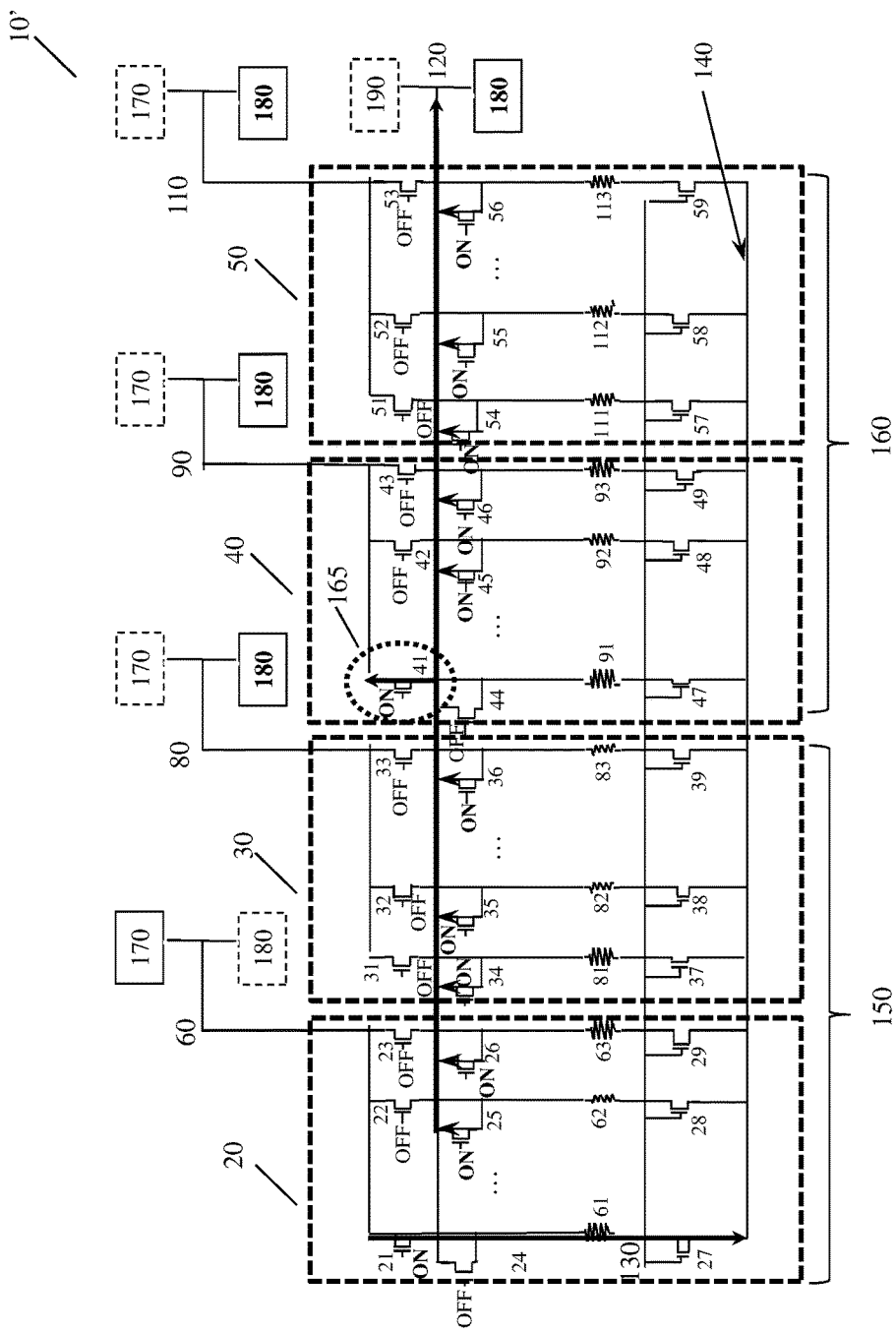
FIG. 3 shows a column multiplexor decoding scheme during a down write operation in accordance with aspects of the present disclosure.

FIG. 3 shows a column multiplexor decoding scheme during a down write operation in accordance with aspects of the present disclosure. FIG. 3 is similar to FIG. 1 except that the column mux circuit 10' includes a pull up 170 with a pull down voltage level (i.e., VPND), a pull down leg 180, a pull up 190 with a pull up voltage level (i.e., VPNU), and another unused global mux output 165.

In a down write operation of FIG. 3, the unused global mux output 165 (i.e., selected but not used column) is hooked up to the pull down leg 180. Therefore, the unused global mux output 165 will act like one of the many pull down current branches which are in parallel from the common source line 140 to the pull down leg 180 on the global source line 120. In FIG. 3, the column mux circuit 10' has a DMASK logic which is updated to add the pull down leg 180 on a selected but not used column (i.e., unused global mux output 165).

In the down write operation of FIG. 3, NMOS transistors 22, 23, 24, 31, 32, 33, 42, 43, 44, 51, 52, and 53 are OFF and NMOS transistors 21, 25, 26, 27, 28, 29, 34, 35, 36, 37, 38, 39, 41, 45, 46, 47, 48, 49, 54, 55, 56, 57, 58, and 59 are ON. Further, as shown in the down write operation of FIG. 3, current flow occurs from transistor 21 to transistor 27. Further, in FIG. 3, current flow occurs through transistors 25, 26, 34, 35, 36, 41, 45, 46, 54, 55, and 56. In particular, transistor 41 is ON, which is different from the conventional circuitry in which the transistor 41 is OFF. In addition, the pull down leg 180 provides a pull down to ground for the transistor 41 to complete a current loop for the down write operation.

Figure 4:
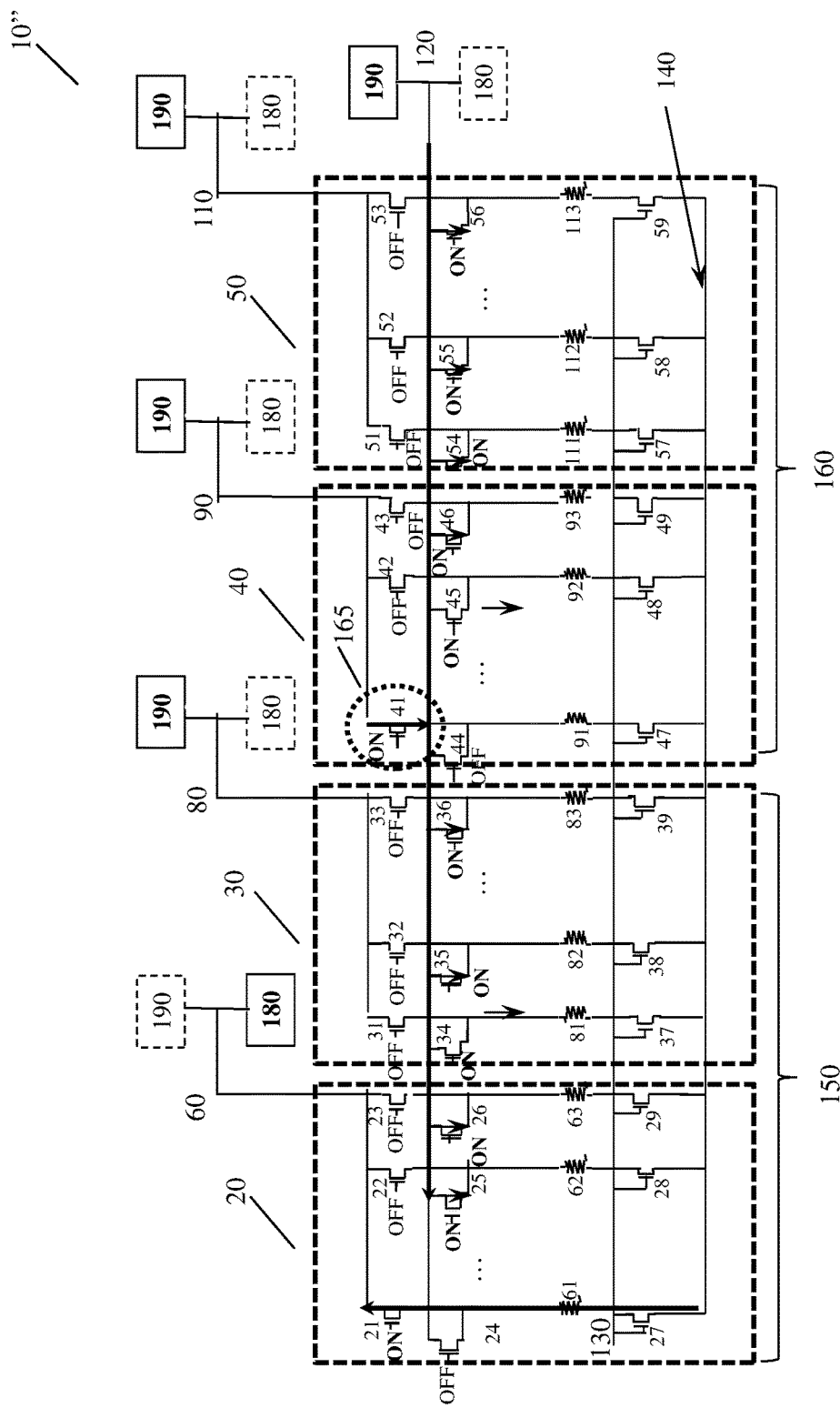
FIG. 4 shows a column multiplexor decoding scheme during an up write operation in accordance with aspects of the present disclosure.

FIG. 4 shows a column multiplexor decoding scheme during an up write operation in accordance with aspects of the present disclosure. FIG. 4 is similar to FIG. 1 except that the column mux circuit 10″ includes a pull down leg 180, a pull up 190 with a pull up voltage level (i.e., VPNU), and another unused global mux output 165.

In an up write operation of FIG. 4, the unused global mux output 165 (i.e., selected but not used column) is hooked up to a pull up 190 leg. In addition, the pull up level follows the pull up voltage level (i.e., VPNU) for the up write operation to avoid leakage current between VPNU and VPND. Therefore, the unused global mux output 165 will act like one of the many pull up current branches in parallel from the pull up 190 leg on the global source line 120 to the common source line 140. In FIG. 4, the column mux circuit 10″ has a DMASK logic which is updated to add an extra pull up 190 leg with a pull up voltage level (i.e., VPNU) on a selected but not used column (i.e., unused global mux output 165).

In the up write operation of FIG. 4, NMOS transistors 22, 23, 24, 31, 32, 33, 42, 43, 44, 51, 52, and 53 are OFF and NMOS transistors 21, 25, 26, 27, 28, 29, 34, 35, 36, 37, 38, 39, 41, 45, 46, 47, 48, 49, 54, 55, 56, 57, 58, and 59 are ON. Further, as shown in the up write operation of FIG. 4, upward current flow occurs from transistor 27 to transistor 21. Further, in FIG. 4, downward current flow occurs through transistors 25, 26, 34, 35, 36, 41, 45, 46, 54, 55, and 56. In particular, transistor 41 is ON in the present disclosure, which is different from the conventional circuitry in which the transistor 41 is OFF. In addition, the transistor 41 connects to a pull up 190 leg so that current flows from a power supply to group 40 and then is combined with the global source line 120 to provide power to a targeted device for a pull up current on the up write operation.

Figure 5:
FIG. 5 shows a layout size comparison table for the column multiplexor decoding scheme in accordance with aspects of the present disclosure.

FIG. 5 shows a layout size comparison table for the column multiplexor decoding scheme in accordance with aspects of the present disclosure. In FIG. 5, the layout size comparison table 300 compares the number of columns being shared in the common source line 140, the number of wires at an upper predefined level of a memory chip, the pitch at the upper predefined level of the memory chip, and a layout area for different decoding schemes. In FIG. 5, the conventional circuitry with a 128 decoding scheme with four (4) reference columns has 128 columns being shared, 264 wires at an upper predefined level of a memory chip, a pitch at an upper predefined level of a memory chip of Y, and a layout area of 2.5*X. In comparison, the present disclose with a 64 decoding scheme with four (4) reference columns has 128 columns being shared, 136 wires at the upper predefined level of the memory chip, a pitch at the upper predefined level of the memory chip of Y, and a layout area of X. Therefore, the present disclosure with a 64 decoding scheme with four (4) reference columns has a layout area saving of 2.5 times in comparison to the conventional circuitry with the 128 decoding scheme with four (4) reference columns. Further, the present disclosure with a 64 decoding scheme with fourth (4) reference columns has a same pitch as the conventional circuitry with the 128 decoding scheme with four (4) reference columns.

In summary, in FIG. 5, the present disclosure with a 64 decoding scheme with four (4) reference columns has a same number of columns being shared (i.e., 128 columns) and a layout height reduction of routing at the upper predefined level of the memory chip to 136 column selection signals (i.e., bit line and source line signals). In the present disclosure with a 64 decoding scheme with four (4) reference columns, a digital mask logic (i.e., digital mask logic (DMASK)) is updated to add control logic for a pull down leg and extra pull up leg with a pull up voltage level (i.e., VPNU level). Further, in the present disclosure with a 64 decoding scheme with four (4) reference columns, a write driver (i.e., write driver (WRDRV)) is updated to add an extra pull up leg with VNPU level on global bit lines. In embodiments, the present disclosure can be further reduced to a 32 decoding scheme with four (4) reference columns with 64 columns being shared. Lastly, the present disclosure can applied to a broad case in which the number of multiplexing signals is reduced by roughly half versus a conventional circuitry scheme.

The circuit and the method for column multiplexor decoding of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for column multiplexor decoding of the present disclosure has been adopted from integrated circuit (IC) technology. For example, the structures are built on wafers and are realized in films of material patterned by photolithographic processes on the top of a wafer. In particular, the fabrication of the circuit and the method for column multiplexor decoding uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a column multiplexor circuit which comprises a plurality of bit line groups to perform a read operation of data using half of a plurality of column selection signals included in the column multiplexor circuit, and each of the bit line groups comprises a plurality of bit lines and a reference bit line column connected to a plurality of transistors, wherein the plurality of bit line groups comprises a first bit line group, a second bit line group, a third bit line group, and a fourth bit line group, and the reference bit line column of the third bit line group is an unused multiplexor output.

2. The structure of claim 1, wherein the reference bit line column of the first bit line group receives the data.

3. The structure of claim 2, wherein the reference bit line column of the second bit line group is a first reference bit line signal.

4. The structure of claim 3, wherein the reference bit line column of the fourth bit line group is a second reference bit line signal.

5. The structure of claim 1, wherein the plurality of transistors in each of the bit line groups are NMOS transistors.

6. The structure of claim 5, wherein the NMOS transistors comprises a first set of NMOS transistors between the reference bit line column and a global source line of the column multiplexor circuit.

7. The structure of claim 6, wherein the NMOS transistors comprises a second set of NMOS transistors between a word line and a common source line of the column multiplexor circuit.

8. A method, comprising:
inputting data to a first reference bit line column included in a first bit line group in a column multiplexor circuit;
selecting a second reference bit line column included in a second bit line group in the column multiplexor circuit as a first reference bit line signal;
selecting a third reference bit line column included in a third bit line group in the column multiplexor circuit as an unused multiplexor output;
selecting a fourth reference bit line column included in a fourth bit line group in the column multiplexor circuit as a second reference bit line signal; and
performing a read operation of the data on the first reference bit line column in the column multiplexor circuit.

9. The method of claim 8, wherein the circuit is a column multiplexor circuit is included in a memory chip.

10. The method of claim 9, further comprising performing one of a down write operation of the data and an up write operation of the data.

11. The method of claim 10, further comprising performing the up write operation of the data.

12. The method of claim 10, further comprising performing the down write operation of the data.

13. The method of claim 8, wherein each of the first bit line group, the second bit line group, the third bit line group, and the fourth bit line group includes a plurality of bit lines and a corresponding plurality of transistors, and each of the first reference bit line column, the second reference bit line column, the third reference bit line column, and the fourth reference bit line column is connected to the corresponding plurality of transistors.

* * * * *